(12) United States Patent
Im

(10) Patent No.: US 7,606,109 B2
(45) Date of Patent: Oct. 20, 2009

(54) WORD LINE DRIVING CIRCUIT AND SEMICONDUCTOR DEVICE USING THE SAME

(75) Inventor: Jae Hyuk Im, Icheon-si (KR)

(73) Assignee: Hynix Semiconductor Inc., Icheon-si (KR)

(*) Notice: Subject to any disclaimer, the term of this patent is extended or adjusted under 35 U.S.C. 154(b) by 51 days.

(21) Appl. No.: 11/822,000

(22) Filed: Jun. 25, 2007

(65) Prior Publication Data

US 2008/0159020 A1    Jul. 3, 2008

(30) Foreign Application Priority Data

Dec. 29, 2006   (KR)   .................. 10-2006-0138766

(51) Int. Cl.
*G11C 8/00* (2006.01)

(52) U.S. Cl. ............. 365/230.06; 365/191; 365/189.11; 365/203

(58) Field of Classification Search ............ 365/230.06, 365/191, 189.11, 203
See application file for complete search history.

(56) References Cited

U.S. PATENT DOCUMENTS

| | | | |
|---|---|---|---|
| 5,258,954 A * | 11/1993 | Furuyama .................. 365/201 |
| 5,412,331 A * | 5/1995 | Jun et al. ................ 365/230.06 |
| 6,160,753 A * | 12/2000 | Shibayama ............ 365/230.06 |
| 6,424,589 B2 * | 7/2002 | Mochida ................ 365/230.06 |
| 6,507,532 B1 * | 1/2003 | Fujino et al. ........... 365/230.03 |
| 7,106,645 B2 | 9/2006 | Mitoma | |
| 2002/0012284 A1 * | 1/2002 | Mochida ................. 365/230.06 |
| 2004/0156260 A1 * | 8/2004 | Lee ....................... 365/230.06 |
| 2005/0128858 A1 * | 6/2005 | Lee et al. ............... 365/230.06 |
| 2006/0104146 A1 * | 5/2006 | Lee ....................... 365/230.06 |
| 2006/0171242 A1 * | 8/2006 | Yoon et al. ............. 365/230.06 |

FOREIGN PATENT DOCUMENTS

| | | |
|---|---|---|
| KR | 10-1997-0051409 | 7/1997 |
| KR | 10-2006-0091017 A | 8/2006 |

\* cited by examiner

*Primary Examiner*—Thong Q Le
(74) *Attorney, Agent, or Firm*—John P. White; Cooper & Dunham LLP

(57) ABSTRACT

A word line driving circuit and a semiconductor device using the same are disclosed. The word line driving circuit includes a second pad separated from a first pad, the first pad being applied with a first ground voltage, the second pad being applied with a second ground voltage, and a word line driver supplied with the second ground voltage, the word line driver driving word lines.

18 Claims, 5 Drawing Sheets

WORD LINE DRIVING CIRCUIT AND SEMICONDUCTOR DEVICE USING THE SAME

BACKGROUND

The present disclosure relates to a word line driving circuit and a semiconductor device using the same, and more particularly to a word line driving circuit which is not influenced by a ground voltage rising in a sensing operation and a semiconductor device using the same.

In general, a semiconductor memory performs, as basic operations thereof, a write operation of storing external input data therein and a read operation of reading data stored therein.

If a drive voltage is applied to a word line selected by an address decoded through a row decoder, then a cell transistor is turned on. Data stored in a capacitor is transferred to a bit line BL through the turned-on cell transistor, amplified by a sensing operation of a bit line sense amplifier (BLSA) and then outputted through a data input/output terminal DQ. This is called a read operation. Conversely, data inputted through the data input/output terminal DQ is transferred through the cell transistor turned on by the word line selection and then stored in the capacitor, which is called a write operation.

In order to perform the read and write operations, it is necessary to turn on the cell transistor. At this time, the word line drive voltage turning on the cell transistor must have a level sufficiently higher than a high level of data stored in a cell, for example, a high voltage (VPP) level, to enable storing data in the capacitor or reading data stored therein.

The sensing operation of the BLSA is performed after the cell transistor is turned on due to the application of a high voltage to the word line. This sensing operation involves a large amount of power consumption, which means that a large amount of current flows to a ground voltage VSS connected to the BLSA. As a result, during the sensing operation, the ground voltage VSS rises to a certain level, as shown in FIG. 1.

In a conventional dynamic random access memory (DRAM), however, both circuits for the sensing operation and circuits for word line driving employ the same ground voltage VSS as a turn-off voltage of the cell transistor. For this reason, a word line driving circuit and a semiconductor device using the same are also influenced by the ground voltage VSS rising in the sensing operation as it is. Consequently, leakage current in the cell transistor increases, resulting in a reduction in data retention time and, in turn, an increase in the possibility of errors occurring in memory operation.

BRIEF SUMMARY

In an aspect of the present disclosure, a word line driving circuit comprises a second pad separated from a first pad, wherein the first pad is applied with a first ground voltage, the second pad is applied with a second ground voltage, and a word line driver is supplied with the second ground voltage drives word lines.

The word line driver may generate a first word line signal for activation of a main word line and a second word line signal for activation of a sub-word line.

Preferably, the word line driver comprises a first driver for generating the first word line signal and a word line select signal for selection of a sub-word line to be activated, in response to an address decoded signal and a second driver configured to receive the word line select signal and generate the second word line signal.

Preferably, the first driver comprises a first word line signal generator supplied and operated with a drive voltage and the second ground voltage, the first word line signal generator generating the first word line signal in response to the address decoded signal and a select signal generator supplied and operated with the drive voltage and second ground voltage, the select signal generator generating the word line select signal in response to the address decoded signal.

Preferably, the first word line signal generator comprises a pull-up device connected between the drive voltage and an output node, and a pull-down device connected between the output node and the second ground voltage. The pull-up device pulls the output node up in response to a precharge signal which is enabled when a precharge operation is performed, and the pull-down device pulls the output node down in response to the decoded signal.

The pull-up device may be a PMOS transistor and the pull-down device may be an NMOS transistor.

Preferably, the select signal generator comprises a pull-up device connected between the drive voltage and an output node, and a pull-down device connected between the output node and the second ground voltage. The pull-up device pulls the output node up in response to a precharge signal which is enabled when a precharge operation is performed, and the pull-down device pulls the output node down in response to the decoded signal.

The pull-up device may be a PMOS transistor and the pull-down device may be an NMOS transistor.

Preferably, the second driver comprises a buffer supplied with the second ground voltage, the buffer buffering the first word line signal.

Preferably, the buffer comprises a pull-up device connected between the drive voltage and an output node, and a pull-down device connected between the output node and the second ground voltage. The pull-up device pulls the output node up in response to the first word line signal, and the pull-down device pulls the output node down in response to the first word line signal.

Preferably, the word line driver further comprises an inverter for inverting the word line select signal and providing the inverted word line select signal to the second driver.

In another aspect of the present disclosure, a semiconductor device comprises a first ground line connected to a first pad, a second ground line connected to a second pad, a sense amplifier connected to the first ground line, and a word line driver connected to the second ground line.

The first pad may be applied with a first ground voltage and the second pad may be applied with a second ground voltage.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Preferred embodiments of the present invention will now be described in detail with reference to the accompanying drawings.

A word line driving circuit and a semiconductor device using the same, according to the present invention, are applied and operated with, as a ground voltage, a voltage separated from a ground voltage rising in a sensing operation. Therefore, it is possible to avoid a reduction in data retention time and, in turn, reduce the possibility of errors occurring in memory operation. It is further possible to apply ground voltages of various levels to the word line driving circuit, thereby making it possible to perform a test operation capable of observing variations in leakage current of a cell transistor.

Figure 1:
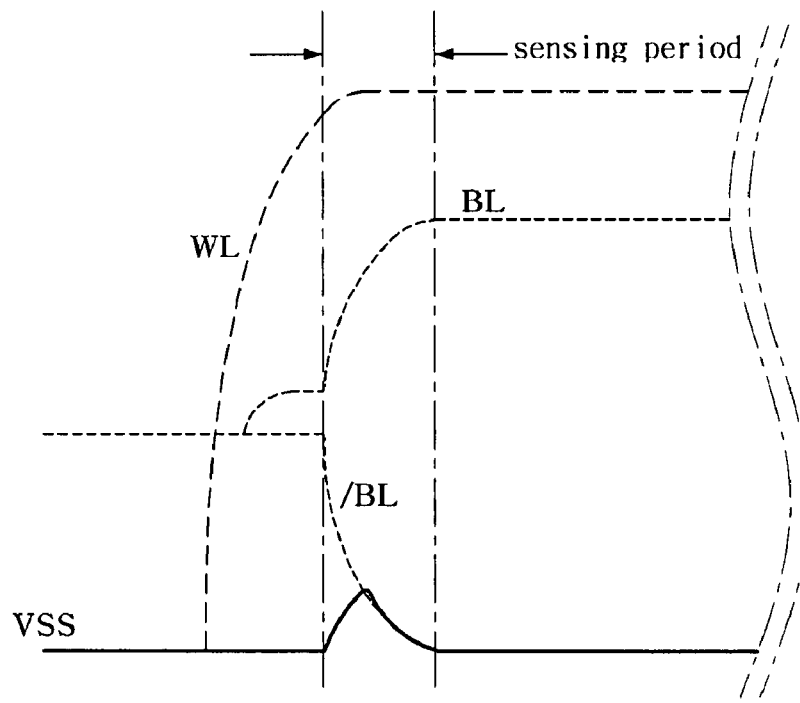
FIG. 1 is a graph illustrating a rising phenomenon of a ground voltage resulting from sensing in an active operation of a conventional semiconductor device.
Figure 2:
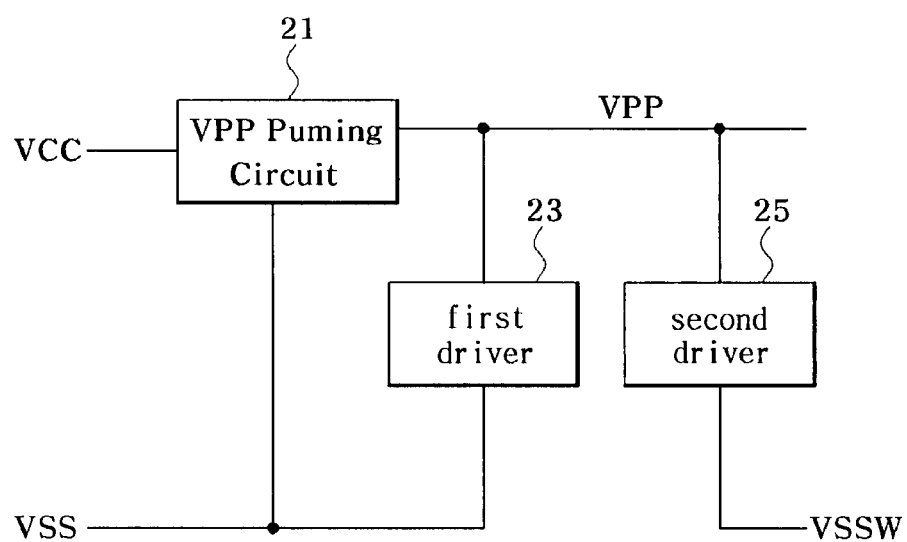
FIG. 2 is a block diagram showing the configuration of a semiconductor device according to an embodiment of the present disclosure.
Figure 3:
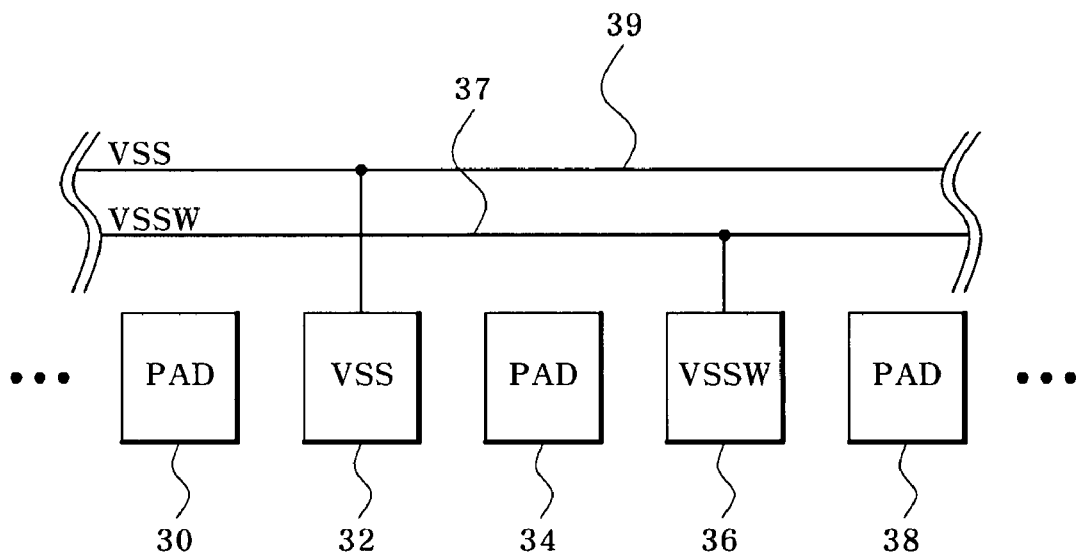
FIG. 3 is a block diagram showing an arrangement of pads to which a first ground voltage and second ground voltage in FIG. 2 are applied.

FIG. 2 is a block diagram showing the configuration of a semiconductor device according to an embodiment of the present invention, and FIG. 3 is a block diagram showing an arrangement of pads to which a first ground voltage and second ground voltage in FIG. 2 are applied.

As shown in FIG. 2, the semiconductor device according to this embodiment comprises a first driver 23 which is supplied and operated with a high voltage VPP and a first ground voltage VSS, and a second driver 25 which is supplied and operated with the high voltage VPP and a second ground voltage VSSW. The first driver 23 includes circuits for a sensing operation of a bit line sense amplifier (BLSA), etc., and the second driver 25 includes circuits for word line driving in an active operation. As shown in FIG. 3, the first ground voltage VSS is applied through a pad 32 and is supplied to the first driver 23 over a ground line 39. The second ground voltage VSSW is applied through a pad 36 and is supplied to the second driver 25 over a ground line 37. In this manner, in the present embodiment, the ground voltages of the second driver 25 and first driver 23 are separated from each other, so that ground voltage variations can be prevented from having effects on other devices. That is, even though the first ground voltage VSS rises in the sensing operation of the first driver 23, the rising of the first ground voltage VSS has no effect on the second driver 25 connected to the second ground voltage VSSW separately applied thereto. Here, the second ground voltage VSSW may be set to the same level as that of the first ground voltage VSS. Alternatively, the second ground voltage VSSW may be set to a different level from that of the first ground voltage VSS according to a different embodiment.

A desired test operation can also be performed by varying the level of the second ground voltage VSSW applied to the pad 36. For example, a voltage of the same level as that of the first ground voltage VSS may be applied to the pad 36 at normal times, and a voltage of a different level from that of the first ground voltage VSS may be applied to the pad 36 in a wafer test or a package test using special bonding so that variations in leakage current of a cell transistor can be observed.

Figure 4A:
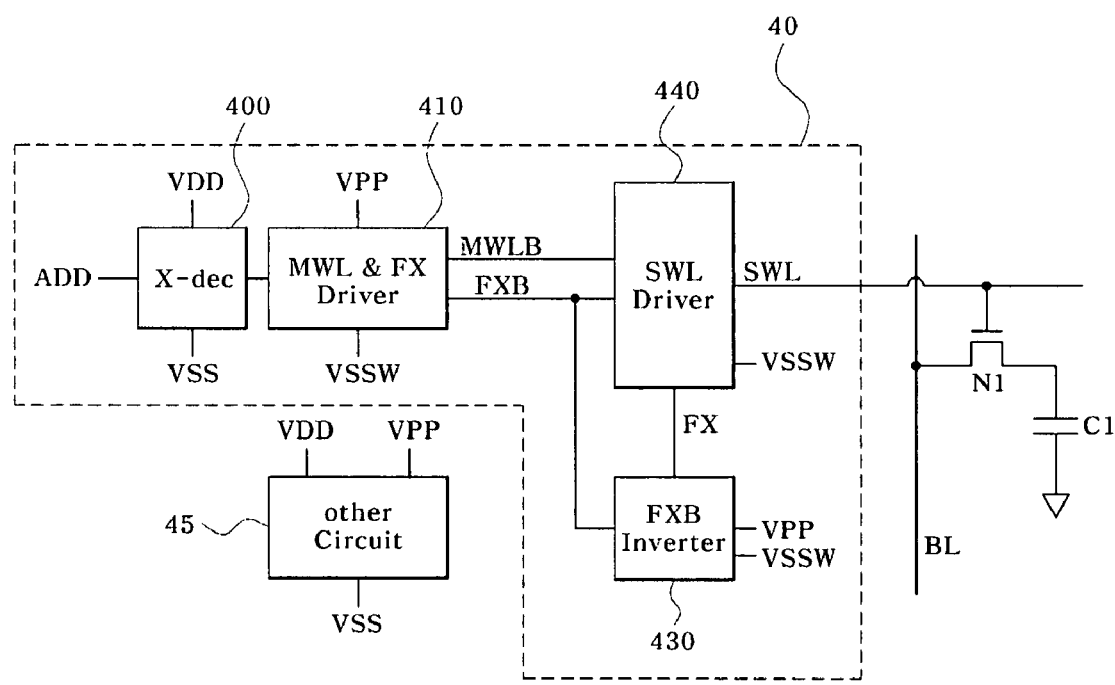
FIG. 4A is a block diagram showing the configuration of a word line driving circuit and a semiconductor device using the same, according to an embodiment of the present disclosure.

FIG. 4A is a block diagram showing the configuration of a word line driving circuit and a semiconductor device using the same, according to a preferred embodiment of the present disclosure.

As shown in FIG. 4A, the semiconductor device according to this embodiment, denoted by reference numeral 40, comprises a row decoder (X-dec) 400 for decoding an address ADD to generate a decoded signal, a first driver (MWL & FX Driver) 410 configured to receive the decoded signal and generate a first word line signal MWLB for activation of a main word line and a word line select signal FXB for selection of a sub-word line to be activated, an inverter (FXB Inverter) 430 for inverting the word line select signal FXB to generate a word line select signal FX, and a second driver (SWL Driver) 440 configured to receive the word line select signals FX and FXB and the first word line signal MWLB and generate a second word line signal SWL for activation of the sub-word line.

In the present embodiment, the first driver 410, inverter 430 and second driver 440 are circuits for word line driving, which are supplied and operated with the second ground voltage VSSW applied separately from the first ground voltage VSS. The reason is to prevent the level rising of the first ground voltage VSS in the sensing operation from having an effect on the word line driving circuit.

The first driver 410 includes a first word line signal generator (MWL Driver) and a select signal generator (FX Driver). The configurations and operations of the first word line signal generator and select signal generator will hereinafter be described in detail with reference to FIGS. 4B and 4C.

Figure 4B:
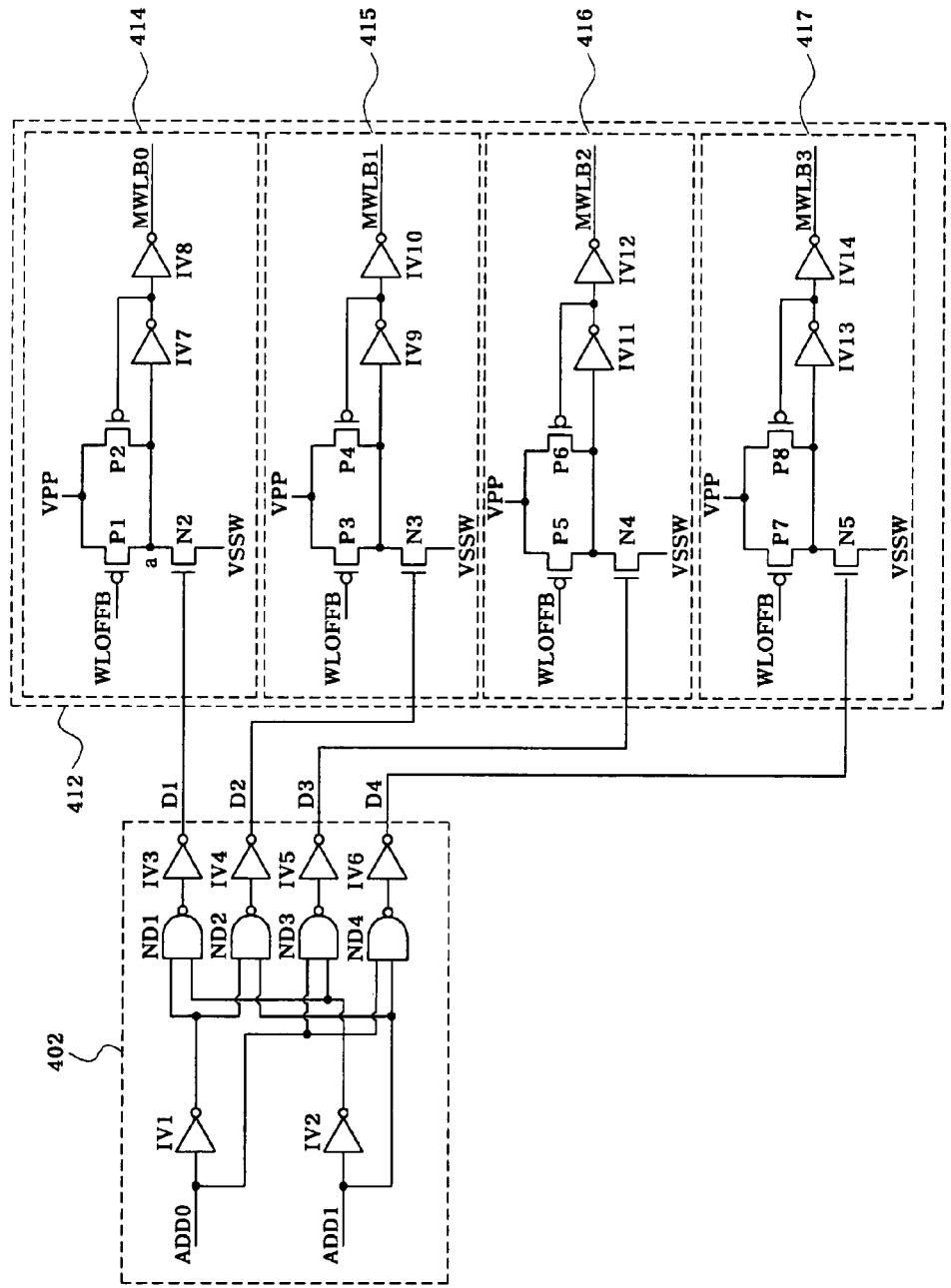
FIGS. 4B are detailed circuit diagrams of a first word line signal generator (MWL Driver) in FIG. 4A.

As shown in FIG. 4B, the row decoder (denoted by reference numeral 402 in FIG. 4B) performs a logic operation with respect to address bit values ADD0 and ADD1 to generate decoded signals D1-D4. For example, when the address bit value ADD0 is high in level and the address bit value ADD1 is low in level, only the decoded signal D3 generated by the row decoder 402 is enabled high in level and the remaining decoded signals D1, D2 and D4 are disabled low in level. That is, the decoded signals D1-D4 are outputted under the condition that only one of the signals D1-D4 is enabled high in level according to a combination of the address bit values ADD0 and ADD1.

The first word line signal generator, denoted by reference numeral 412, includes first to fourth signal generators 414-417 for generating first word line signals MWLB0-MWLB3, respectively, in response to the decoded signals D1-D4 inputted thereto. The first signal generator 414 includes a PMOS transistor P1 connected between the high voltage VPP and a node a for pulling the node a up in response to a precharge signal WLOFFB which is enabled low in level when a precharge operation is performed, an NMOS transistor N2 connected between the node a and the second ground voltage VSSW for pulling the node a down in response to the decoded signal D1, an inverter IV7 for inverting a signal at the node a, a PMOS transistor P2 for pulling the node a up in response to an output signal from the inverter IV7, and an inverter IV8 for inverting the output signal from the inverter IV7 and outputting the inverted signal as the first word line signal MWLB0. With this configuration, the first signal generator 414 outputs the first word line signal MWLB0 which is disabled high in level based on a voltage at the node a pulled up in the precharge operation. At the time that the decoded signal D1 is enabled high in level after the precharge operation is performed, the node a is pulled down to a low level, thereby causing the first word line signal MWLB0 to be enabled low in level. The configurations and operations of the second to fourth signal generators 415-417 are the same as those of the first signal generator 414, with the exception of only the decoded signals D2-D4 inputted thereto and the first word line signals MWLB1-MWLB3 outputted therefrom, and a detailed description thereof will thus be omitted. In the present embodiment, the first word line signal MWLB2 is enabled low in level.

Figure 4C:
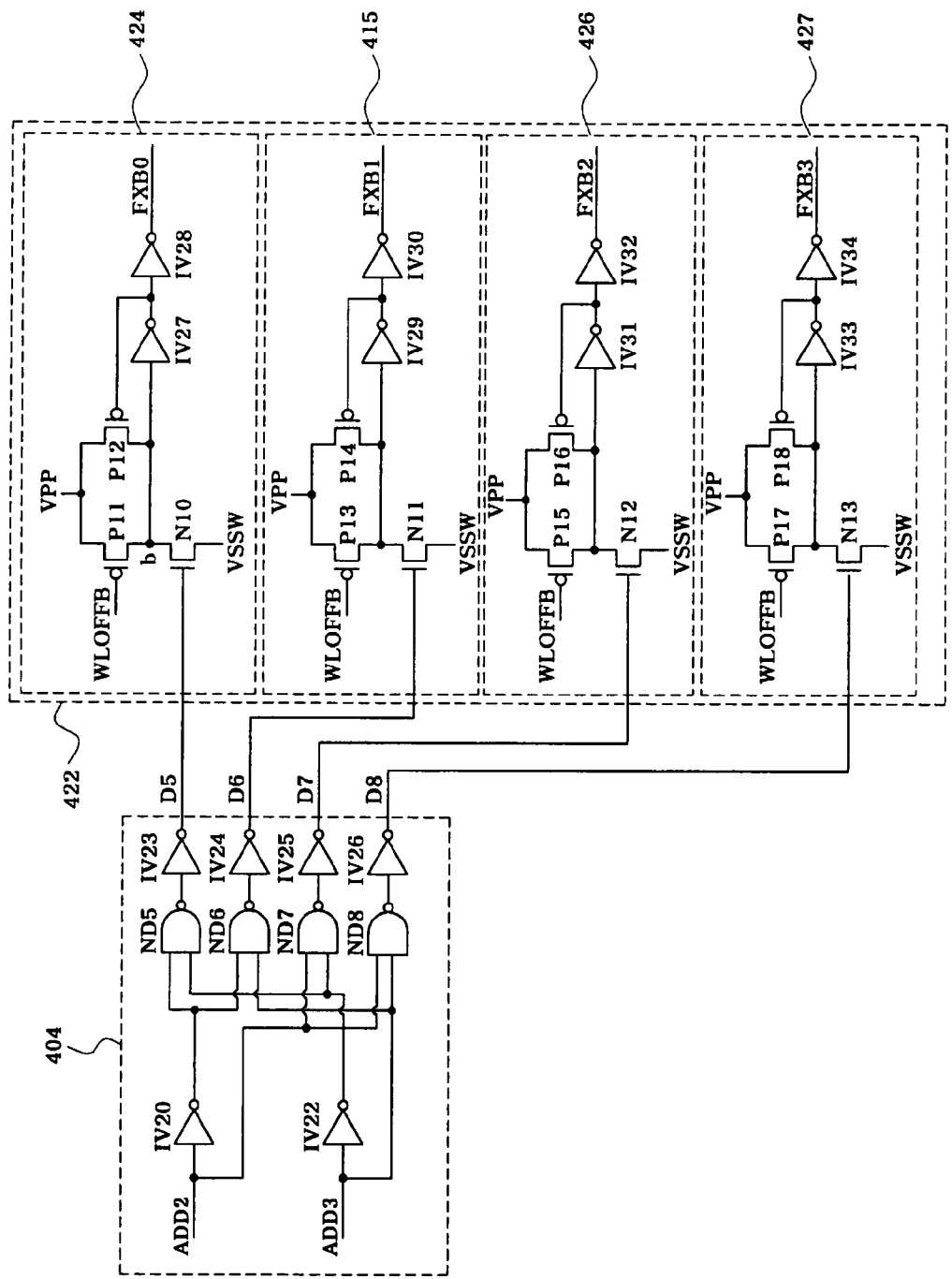
FIG. 4C are detailed circuit diagrams of a select signal generator (FX Driver) in FIG. 4A.

As shown in FIG. 4C, the row decoder (denoted by reference numeral 404 in FIG. 4C) performs a logic operation with respect to address bit values ADD2 and ADD3 to generate decoded signals D5-D8. For example, when the address bit value ADD2 is high in level and the address bit value ADD3 is low in level, only the decoded signal D7 generated by the row decoder 404 is enabled high in level and the remaining decoded signals D5, D6 and D8 are disabled low in level. That is, the decoded signals D5-D8 are outputted under the condition that only one thereof is enabled high in level according to a combination of the address bit values ADD2 and ADD3.

The select signal generator, denoted by reference numeral 422, includes first to fourth signal generators 424-427 for generating word line select signals FXB0-FXB3, respectively, in response to the decoded signals D5-D8 inputted thereto. The first signal generator 424 includes a PMOS transistor P11 connected between the high voltage VPP and a node b for pulling the node b up in response to the precharge signal WLOFFB which is enabled low in level when the precharge operation is performed, an NMOS transistor N10 connected between the node b and the second ground voltage VSSW for pulling the node b down in response to the decoded signal D5, an inverter IV27 for inverting a signal at the node b, a PMOS transistor P12 for pulling the node b up in response to an output signal from the inverter IV27, and an inverter IV28 for inverting the output signal from the inverter IV27 and outputting the inverted signal as the word line select signal FXB0. With this configuration, the first signal generator 424 outputs the word line select signal FXB0 which is disabled high in level based on a voltage at the node b pulled up in the precharge operation. At the time that the decoded signal D5 is enabled high in level after the precharge operation is performed, the node b is pulled down to a low level, thereby causing the word line select signal FXB0 to be enabled low in level. The configurations and operations of the second to fourth signal generators 425-427 are the same as those of the first signal generator 424, with the exception of only the decoded signals D6-D8 inputted thereto and the word line select signals FXB1-FXB3 outputted therefrom, and a detailed description thereof will thus be omitted. In the present embodiment, the word line select signal FXB2 is enabled low in level.

Figure 4D:
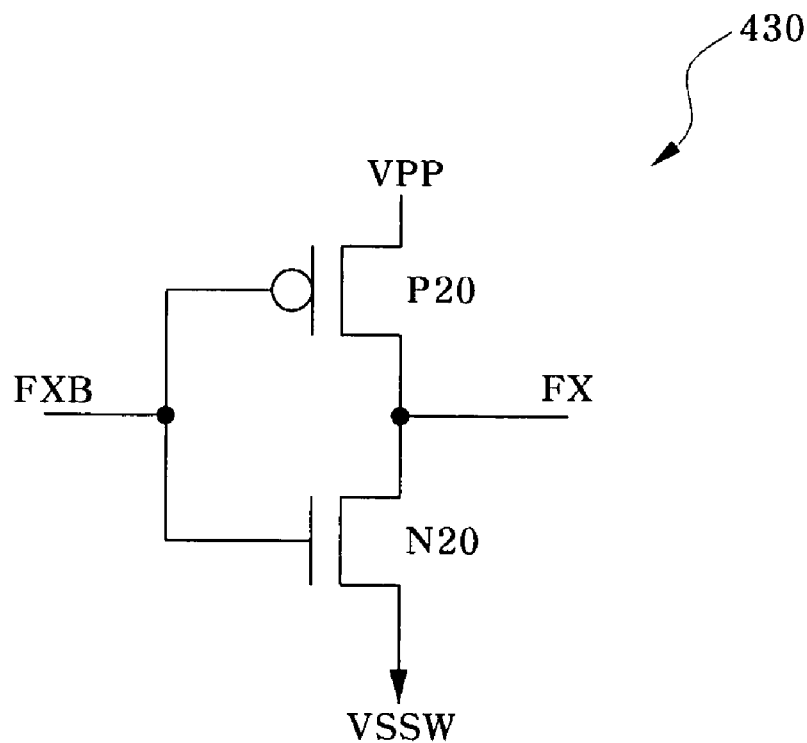
FIG. 4D is a detailed circuit diagram of an inverter in FIG. 4A.

The inverter 430 includes, as shown in FIG. 4D, a PMOS transistor P20 and an NMOS transistor N20 connected in series between the high voltage VPP and the second ground voltage VSSW. With this configuration, the inverter 430 receives and inverts the word line select signal FXB and outputs the inverted signal as the word line select signal FX.

Figure 4E:
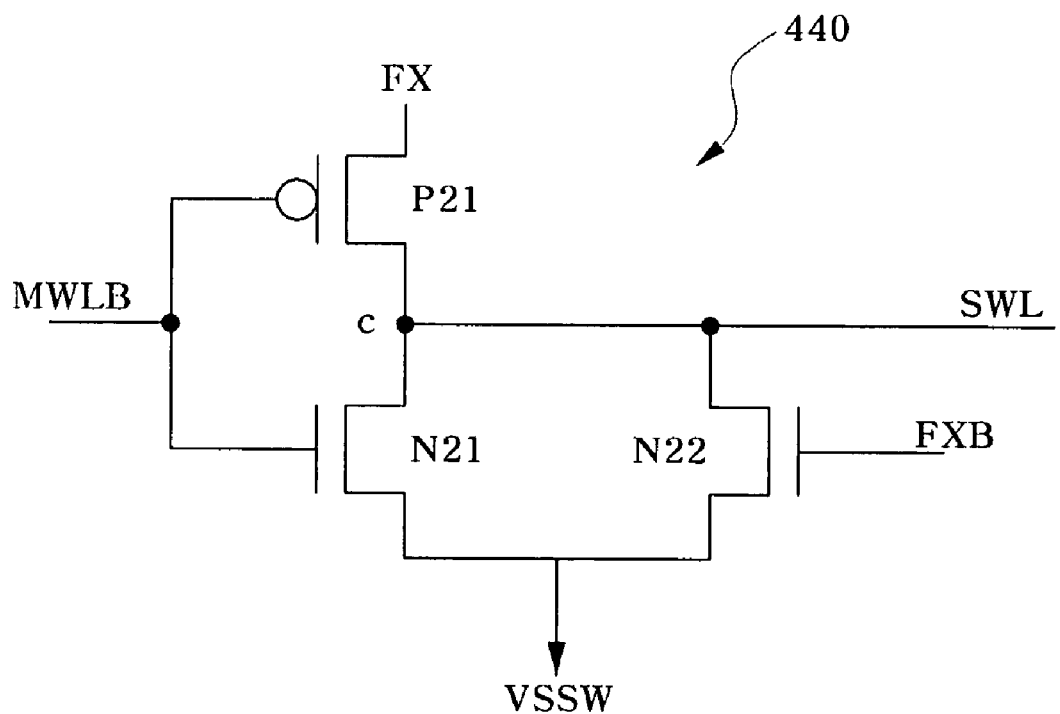
FIG. 4E is a detailed circuit diagram of a second driver in FIG. 4A.

The second driver 440 includes, as shown in FIG. 4E, a PMOS transistor P21 connected between a word line select signal FX input terminal and a node c for pulling the node c up in response to the first word line signal MWLB, an NMOS transistor N21 connected between the node c and the second ground voltage VSSW for pulling the node c down in response to the first word line signal MWLB, and an NMOS transistor N22 connected between the node c and the second ground voltage VSSW for pulling the node c down in response to the word line select signal FXB.

The operation of the second driver 440 with this configuration will hereinafter be described. When the first word line signal MWLB is enabled low in level, the word line select signal FX is transferred as the second word line signal SWL. At this time, if the word line select signal FX is enabled to a high level, the second word line signal SWL is enabled to a high level, too. On the other hand, when the first word line signal MWLB is disabled high in level, the second word line signal SWL is disabled low in level. The second driver 440 shown in FIG. 4E is preferably provided on a second word line signal SWL basis.

Although the various embodiments and examples have been described above for illustrative purposes to apply the ground voltage VSSW separated from the ground voltage VSS to the word line driving circuit and the semiconductor device using the same, the subject matter of this disclosure is widely applicable to various circuits in which the ground voltage VSS must be prevented from having negative effects.

In addition, those skilled in the art will appreciate that various modifications, additions and substitutions are possible, without departing from the scope and spirit of the disclosure and the accompanying claims.

The present application claims priority to Korean patent application number 10-2006-138766, filed on, which is incorporated by reference in its entirety.

What is claimed is:

1. A word line driving circuit comprising:
   a row decoder supplied with a first ground voltage from a first pad, for decoding an address to generate a decoded signal;
   a first driver supplied with a second ground voltage from a second pad and configured to receive the decoded signal and generate a first word line signal for activation of a main word line and a word line select signal for selection of a sub-word line to be activated;
   an inverter for inverting the word line select signal; and
   a second driver supplied with the second ground voltage from the second pad and configured to receive the output signal of the inverter and the first word line signal and generate a second word line signal for activation of the sub-word line.

2. The word line driving circuit according to claim 1, wherein the first driver comprises:
   a first word line signal generator supplied and operated with a drive voltage and the second ground voltage, the first word line signal generator generating the first word line signal in response to the decoded signal; and
   a select signal generator supplied and operated with the drive voltage and second ground voltage, the select signal generator generating the word line select signal in response to the decoded signal.

3. The word line driving circuit according to claim 2, wherein the first word line signal generator comprises:
   a pull-up device connected between the drive voltage and an output node, the pull-up device pulling the output node up in response to a precharge signal which is enabled when a precharge operation is performed; and
   a pull-down device connected between the output node and the second ground voltage, the pull-down device pulling the output node down in response to the decoded signal.

4. The word line driving circuit according to claim 3, wherein the pull-up device is a PMOS transistor and the pull-down device is an NMOS transistor.

5. The word line driving circuit according to claim 2, wherein the select signal generator comprises:
   a pull-up device connected between the drive voltage and an output node, the pull-up device pulling the output node up in response to a precharge signal which is enabled when a precharge operation is performed; and a pull-down device connected between the output node and the second ground voltage, the pull-down device pulling the output node down in response to the decoded signal.

6. The word line driving circuit according to claim 5, wherein the pull-up device is a PMOS transistor and the pull-down device is an NMOS transistor.

7. The word line driving circuit according to claim 1, wherein the second driver comprises a buffer supplied with the second ground voltage, the buffer buffering the first word line signal.

8. The word line driving circuit according to claim 7, wherein the buffer comprises:

a pull-up device connected between the drive voltage and an output node, the pull-up device pulling the output node up in response to the first word line signal; and a pull-down device connected between the output node and the second ground voltage, the pull-down device pulling the output node down in response to the first word line signal.

9. The word line driving circuit according to claim 8, wherein the pull-up device is a PMOS transistor and the pull-down device is an NMOS transistor.

10. A semiconductor device comprising:

a first ground line connected to a first pad applied with a first ground voltage;

a second ground line connected to a second pad applied with a second ground voltage;

a sense amplifier connected to the first ground line;

a row decoder connected to the first ground line and supplied with the first ground voltage, for decoding an address to generate a decoded signal;

a first driver connected to the second ground line and supplied with a second ground voltage, and configured to receive the decoded signal and generate a first word line signal for activation of a main word line and a word line select signal for selection of a subword line to be activated;

an inverter for inverting the word line select signal; and a second driver connected to the second ground line and supplied with a second ground voltage, and configured to receive the output signal of the inverter and the first word line signal and generate a second word line signal for activation of the sub-word line.

11. The semiconductor device according to claim 10, wherein the first driver comprises:

a first word line signal generator supplied and operated with a drive voltage and the second ground voltage, the first word line signal generator generating the first word line signal in response to the decoded signal; and a select signal generator supplied and operated with the drive voltage and second ground voltage, the select signal generator generating the word line select signal in response to the decoded signal.

12. The semiconductor device according to claim 11, wherein the first word line signal generator comprises:

a pull-up device connected between the drive voltage and an output node, the pull-up device pulling the output node up in response to a precharge signal which is enabled when a precharge operation is performed; and a pull-down device connected between the output node and the second ground voltage, the pull-down device pulling the output node down in response to the decoded signal.

13. The semiconductor device according to claim 12, wherein the pull-up device is a PMOS transistor and the pull-down device is an NMOS transistor.

14. The semiconductor device according to claim 11, wherein the select signal generator comprises:

a pull-up device connected between the drive voltage and an output node, the pull-up device pulling the output node up in response to a precharge signal which is enabled when a precharge operation is performed; and a pull-down device connected between the output node and the second ground voltage, the pull-down device pulling the output node down in response to the decoded signal.

15. The semiconductor device according to claim 14, wherein the pull-up device is a PMOS transistor and the pull-down device is an NMOS transistor.

16. The semiconductor device according to claim 10, wherein the second driver comprises a buffer supplied with the second ground voltage, the buffer buffering the first word line signal.

17. The semiconductor device according to claim 16, wherein the buffer comprises:

a pull-up device connected between the drive voltage and an output node, the pull-up device pulling the output node up in response to the first word line signal; and a pull-down device connected between the output node and the second ground voltage, the pull-down device pulling the output node down in response to the first word line signal.

18. The semiconductor device according to claim 17, wherein the pull-up device is a PMOS transistor and the pull-down device is an NMOS transistor.

* * * * *